(12) United States Patent
Leung et al.

(10) Patent No.: US 8,709,162 B2
(45) Date of Patent: Apr. 29, 2014

(54) ACTIVE COOLING SUBSTRATE SUPPORT

(75) Inventors: Samuel Leung, San Jose, CA (US); Su Ho Cho, Saratoga, CA (US); William Allan Bagley, Tokyo (JP)

(73) Assignee: Applied Materials, Inc., Santa Clara, CA (US)

( * ) Notice: Subject to any disclaimer, the term of this patent is extended or adjusted under 35 U.S.C. 154(b) by 1138 days.

(21) Appl. No.: 11/206,245

(22) Filed: Aug. 16, 2005

(65) Prior Publication Data

US 2007/0039942 A1    Feb. 22, 2007

(51) Int. Cl.
    C23C 16/458    (2006.01)
    C23C 16/46     (2006.01)
    H01L 21/306    (2006.01)
    H01L 21/3065   (2006.01)
    H01J 37/32     (2006.01)
    H01L 21/67     (2006.01)

(52) U.S. Cl.
    CPC .............. *C23C 16/463* (2013.01); *C23C 16/46* (2013.01); *C23C 16/4586* (2013.01); *C23C 16/4583* (2013.01); *C23C 16/4582* (2013.01); *C23C 16/458* (2013.01); *H01J 37/32715* (2013.01); *H01J 37/32724* (2013.01); *H01L 21/67069* (2013.01); *H01L 21/67103* (2013.01)
    USPC ...... 118/728; 118/724; 118/725; 156/345.51; 156/345.52; 156/345.53

(58) Field of Classification Search
    CPC .................... H01L 21/3065; H01L 21/67103; H01J 37/32724; H01J 2237/2001; H01J 37/32715; C23C 16/46; C23C 16/463; C23C 16/458; C23C 16/4582; C23C 16/4583

USPC ........ 156/345.51–345.55; 118/724–725, 728; 219/443.1
    See application file for complete search history.

(56) References Cited

U.S. PATENT DOCUMENTS

| 2,571,949 | A | * | 10/1951 | Sandler ............................ 126/53 |
| 3,669,812 | A | * | 6/1972 | Ensslin ........................... 165/263 |
| 3,711,681 | A | * | 1/1973 | Leuschner et al. ............. 392/467 |
| 3,848,665 | A | * | 11/1974 | Uerlichs et al. ............... 165/168 |
| 4,747,450 | A | * | 5/1988 | Ikegame et al. ............... 165/168 |
| 4,834,855 | A | * | 5/1989 | Bloomquist et al. ..... 204/192.15 |

(Continued)

FOREIGN PATENT DOCUMENTS

| JP | 2000-124139 A | 4/2000 |
| JP | 2002-110774 A | 4/2002 |
| JP | 2004273619 A | 9/2004 |

OTHER PUBLICATIONS

Taiwan Search Report, Patent Application No. 95128335, dated Nov. 28, 2008.

(Continued)

*Primary Examiner* — Jeffrie R Lund
(74) *Attorney, Agent, or Firm* — Patterson & Sheridan, LLP

(57) ABSTRACT

A substrate support assembly and method for controlling the temperature of a substrate within a process chamber with a temperature uniformity of +/−5° C. are provided. A substrate support assembly includes a thermally conductive body comprising an aluminum material, a substrate support surface on the surface of the thermally conductive body and adapted to support the large area glass substrate thereon, one or more heating elements embedded within the thermally conductive body, and one or more cooling channels embedded within the thermally conductive body and positioned around the one or more heating elements. A process chamber comprising the substrate support assembly of the invention is also provided.

17 Claims, 9 Drawing Sheets

(56) References Cited

U.S. PATENT DOCUMENTS

| | | | |
|---|---|---|---|
| 5,079,481 A * | 1/1992 | Moslehi | 315/111.41 |
| 5,155,331 A * | 10/1992 | Horiuchi et al. | 219/121.43 |
| 5,192,849 A * | 3/1993 | Moslehi | 219/121.43 |
| 5,228,501 A * | 7/1993 | Tepman et al. | 165/80.1 |
| 5,558,717 A * | 9/1996 | Zhao et al. | 118/715 |
| 5,582,866 A * | 12/1996 | White | 427/248.1 |
| 5,844,205 A * | 12/1998 | White et al. | 219/390 |
| 5,906,683 A * | 5/1999 | Chen et al. | 118/724 |
| 6,035,101 A * | 3/2000 | Sajoto et al. | 392/416 |
| 6,073,576 A * | 6/2000 | Moslehi et al. | 118/723 E |
| 6,087,632 A | 7/2000 | Mizosaki et al. | |
| 6,147,334 A * | 11/2000 | Hannigan | 219/544 |
| 6,371,357 B1 | 4/2002 | Watanabe | |
| 6,376,815 B1 | 4/2002 | Watanabe | |
| 6,392,205 B1 * | 5/2002 | Minonishi | 219/443.1 |
| 6,403,926 B2 * | 6/2002 | Li | 219/390 |
| 6,477,980 B1 | 11/2002 | White et al. | |
| 6,500,356 B2 | 12/2002 | Goto et al. | |
| 6,508,885 B1 * | 1/2003 | Moslehi et al. | 118/728 |
| 6,514,073 B1 * | 2/2003 | Toshima et al. | 432/85 |
| 6,552,311 B2 | 4/2003 | Watanabe | |
| 6,557,747 B2 | 5/2003 | Watanabe | |
| 6,652,655 B1 * | 11/2003 | Ho | 118/725 |
| 6,660,975 B2 | 12/2003 | Wang et al. | |
| 6,700,099 B2 * | 3/2004 | Cole et al. | 219/444.1 |
| 6,740,853 B1 * | 5/2004 | Johnson et al. | 219/444.1 |
| 6,853,533 B2 * | 2/2005 | Parkhe | 361/234 |
| 6,908,512 B2 * | 6/2005 | Ivanov et al. | 118/503 |
| 6,942,753 B2 * | 9/2005 | Choi et al. | 156/345.34 |
| 6,951,821 B2 * | 10/2005 | Hamelin et al. | 438/706 |
| RE39,020 E * | 3/2006 | Hama et al. | 156/345.48 |
| 7,031,600 B2 * | 4/2006 | Yadav et al. | 392/389 |
| 7,083,701 B2 * | 8/2006 | Ohmi et al. | 156/345.41 |
| 7,270,713 B2 * | 9/2007 | Blonigan et al. | 118/715 |
| 7,429,718 B2 * | 9/2008 | Inagawa et al. | 219/444.1 |
| 8,075,729 B2 * | 12/2011 | Holland et al. | 156/345.27 |
| 8,608,852 B2 * | 12/2013 | Mahadeswaraswamy et al. | 118/715 |
| 2002/0050246 A1 * | 5/2002 | Parkhe | 118/500 |
| 2002/0189940 A1 * | 12/2002 | Tsai et al. | 204/298.15 |
| 2003/0047283 A1 * | 3/2003 | Parkhe et al. | 156/345.51 |
| 2004/0129211 A1 * | 7/2004 | Blonigan et al. | 118/715 |
| 2004/0206305 A1 * | 10/2004 | Choi et al. | 118/715 |
| 2004/0206747 A1 * | 10/2004 | Ito | 219/468.1 |
| 2005/0223986 A1 * | 10/2005 | Choi et al. | 118/715 |
| 2005/0251990 A1 * | 11/2005 | Choi et al. | 29/558 |
| 2005/0255257 A1 * | 11/2005 | Choi et al. | 427/585 |
| 2006/0228496 A1 * | 10/2006 | Choi et al. | 427/569 |
| 2006/0266288 A1 * | 11/2006 | Choi | 118/715 |
| 2007/0029642 A1 * | 2/2007 | Inagawa et al. | 257/625 |
| 2007/0039942 A1 * | 2/2007 | Leung et al. | 219/443.1 |
| 2007/0221128 A1 * | 9/2007 | Choi et al. | 118/715 |
| 2007/0283884 A1 * | 12/2007 | Tiller et al. | 118/715 |
| 2008/0035306 A1 * | 2/2008 | White et al. | 165/61 |
| 2008/0092818 A1 * | 4/2008 | Fink et al. | 118/724 |
| 2010/0300359 A1 * | 12/2010 | Armour et al. | 118/724 |
| 2011/0303641 A1 * | 12/2011 | Mahadeswaraswamy et al. | 216/67 |
| 2012/0006493 A1 * | 1/2012 | White et al. | 156/345.52 |
| 2012/0196242 A1 * | 8/2012 | Volfovski et al. | 432/92 |
| 2014/0004706 A1 * | 1/2014 | Miya et al. | 438/710 |

OTHER PUBLICATIONS

Taiwan Office Action, Application No. 095128335, dated Apr. 17, 2009 (With English Translation).
Korean Patent Office Action Patent Application No. 10-200-0077289; dated Jan. 29, 2013.
Chinese Office Action, Application No. 200610121501.5, dated Aug. 12, 2010 (With English Translation).
Second Chinese Office Action dtd Mar. 16, 2011 for Chinese Application No. 200610121501.5.
Concise Summary of Reasons for Rejection dated Oct. 9, 2012, for Japanese Application No. 2006-222039.
Notice of Rejection for Japanese Patent Application No. 2006-222039 dated Oct. 25, 2011.
Third Chinese Office Action dated Jun. 29, 2009 for Chinese Application No. 200610121501.5.

* cited by examiner

ACTIVE COOLING SUBSTRATE SUPPORT

BACKGROUND OF THE INVENTION

1. Field of the Invention

Embodiments of the invention generally provide a substrate support utilized in flat panel substrate processing.

2. Description of the Related Art

Liquid crystal displays or flat panel displays (FPD) are commonly used for active matrix displays such as computer and television monitors, personal digital assistants (PDAs), and cell phones, as well as solar cells and the like. Generally, a flat panel display comprises two glass plates having a layer of liquid crystal material sandwiched therebetween. At least one of the glass plates includes at least one conductive film disposed thereon that is coupled to a power supply. Power supplied to the conductive film from the power supply changes the orientation of the crystal material, creating a pattern such as texts or graphics on the flat panel displays. Substrates utilized for flat panel fabrication are large in size, often exceeding 300 mm×400 mm, and are envisioned up to and beyond 4 square meters in surface area. Correspondingly, the substrate supports utilized to process large area substrates are proportionately large to accommodate the large surface area of the substrate.

Plasma enhanced chemical vapor deposition (PECVD) is frequently employed in flat panel display fabrication to deposit thin film on a substrate. PECVD is generally accomplished by introducing a precursor gas into a vacuum process chamber to be energized (e.g., excited) into a plasma. FIG. 1 is a schematic cross-sectional view of a CVD process chamber 2 having a support plate 18 and a susceptor 22 disposed therein to support a substrate 12 (not to scale). Reactive precursor gases flowing into a diffuser plate 16 through a gas inlet 14 near the top of the process chamber 2 are excited to form a layer of material on the surface of the substrate 12 that is positioned on a temperature controlled substrate support or susceptor 22. An opening 10 disposed in the sidewall 8 allows a robot (not shown) to deliver and retrieve the substrate 12 to and from the process chamber 2. A support plate 18 coupled to a support shaft 20 to support the susceptor 22 is typically made of a single rectangular plate of ceramic material, such as aluminum oxide, and closely covers the area of the susceptor 22. The susceptor 22 for a CVD chamber historically has been made of a single rectangular plate of aluminum and is typically heated by an embedded heater (not shown) with thermocouples and energy supplied from a power source 24. The heater can also be positioned to the back side of the susceptor 22 or clamped onto the susceptor 22 by a clamp plate.

Generally, the substrate support of the process chamber 2 may be heated from room temperature to a high temperature of less than 500° C., and the susceptor 22 can deflect and "droop" without adequate support. The ceramic material of the support plate 18 has been used to support the susceptor 22 made of ductile aluminum. However, ceramic is a relatively poor thermal conductor and, thus, demonstrates a temperature gradient between a hotter upper surface of the support plate 18 that contacts the heated susceptor and a cooler lower surface of the support plate 18 and as a result, the support plate 18 deflects downwardly at its outer perimeter. A substrate supported by the susceptor is prone to conform to the susceptor and, thus, also deflects. As a result, the vertical spacing between the diffuser plate 16 and the substrate 12 varies between a central portion of the substrate 12 having a distance 34 from the diffuser plate 16. A greater distance 36 resulting from large degree of deflection is located near it perimeter. The difference in the vertical spacing (i.e., substrate deflection distance) greatly decreases uniformity of the deposited films disposed on the large area substrate.

In addition, after striking a plasma inside a PEPVD chamber, the energy from the plasma also creates heat directed toward the substrate and the substrate support, e.g., the susceptor. Therefore, there is a problem of a temporal temperature increase or spike (e.g., about 30-50° C. increase or 20%-30% temperature increase from 150° C.) for the processing substrate disposed on the susceptor. Such drastic temperature variation needs to be controlled in order to maintain a constant temperature on the substrate being processed. In addition, cooling of the susceptor of a process chamber is also needed after processing and during remote plasma cleaning, RF assist cooling, and/or chamber part cleaning and maintenance. However, most PECVD chambers either do not have any cooling design inside the susceptor (i.e., slowly cool down by itself to room temperature) or use cooling mechanisms surrounding the back side of the substrate, not in the susceptor. These prior art designs present difficulties to maintain a constant process temperature for a large area substrate, often leading to local temperature variations over the large surface of the substrate. As a result, variations in film thickness, often manifesting as spots of thinner film thickness, have been observed, which is detrimental to the next generation of flat panel or solar cell devices.

Therefore, there is a need for an improved method and apparatus to control the temperature of a substrate support constantly to a desired range.

SUMMARY OF THE INVENTION

Embodiments of a process chamber, substrate support assembly, and method for controlling the temperature of a substrate within a process chamber are provided. In one embodiment of the invention, a substrate support assembly adapted to support a large area substrate inside a process chamber includes a thermally conductive body, a substrate support surface on the surface of the thermally conductive body and adapted to support the large area substrate thereon, one or more heating elements embedded within the thermally conductive body, and one or more cooling channels embedded within the thermally conductive body above the one or more heating elements.

In another embodiment, a substrate support assembly may include one or more cooling channels embedded within the thermally conductive body and looped around the positions of the one or more heating elements in a spiral or vortex configuration. In still another embodiment, the one or more cooling channels include in-flow loops and out-flow loops. The in-flow loops and/or the out-flow loops may each be configured in a spiral configuration within the thermally conductive body. In still another embodiment, the neighboring cooling channels include cooling fluids flowing in opposite in-flow and out-flow directions.

In addition, a process chamber including a chamber body, a gas distribution plate assembly, and a substrate support assembly for supporting a large area substrate thereon is provided. The substrate support assembly may include a thermally conductive body, a substrate support surface on the surface of the thermally conductive body and adapted to support the large area glass substrate thereon, one or more heating elements embedded within the thermally conductive body, and one or more cooling channels embedded within the thermally conductive body above the one or more heating elements and positioned around the one or more heating elements in a spiral or vortex configuration.

In yet another embodiment, a method for maintaining the temperature of a large area substrate inside a process chamber includes positioning the large area substrate on a substrate support surface of a substrate support assembly of the process chamber, flowing a gaseous cooling material constantly inside the one or more cooling channels at a constant flow rate, and maintaining the temperature of the large area substrate by adjusting the heating power of the one or more heating elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. To facilitate understanding, identical reference numerals have been used, where possible, to designate identical elements that are common to the figures.

DETAILED DESCRIPTION

Figure 1:
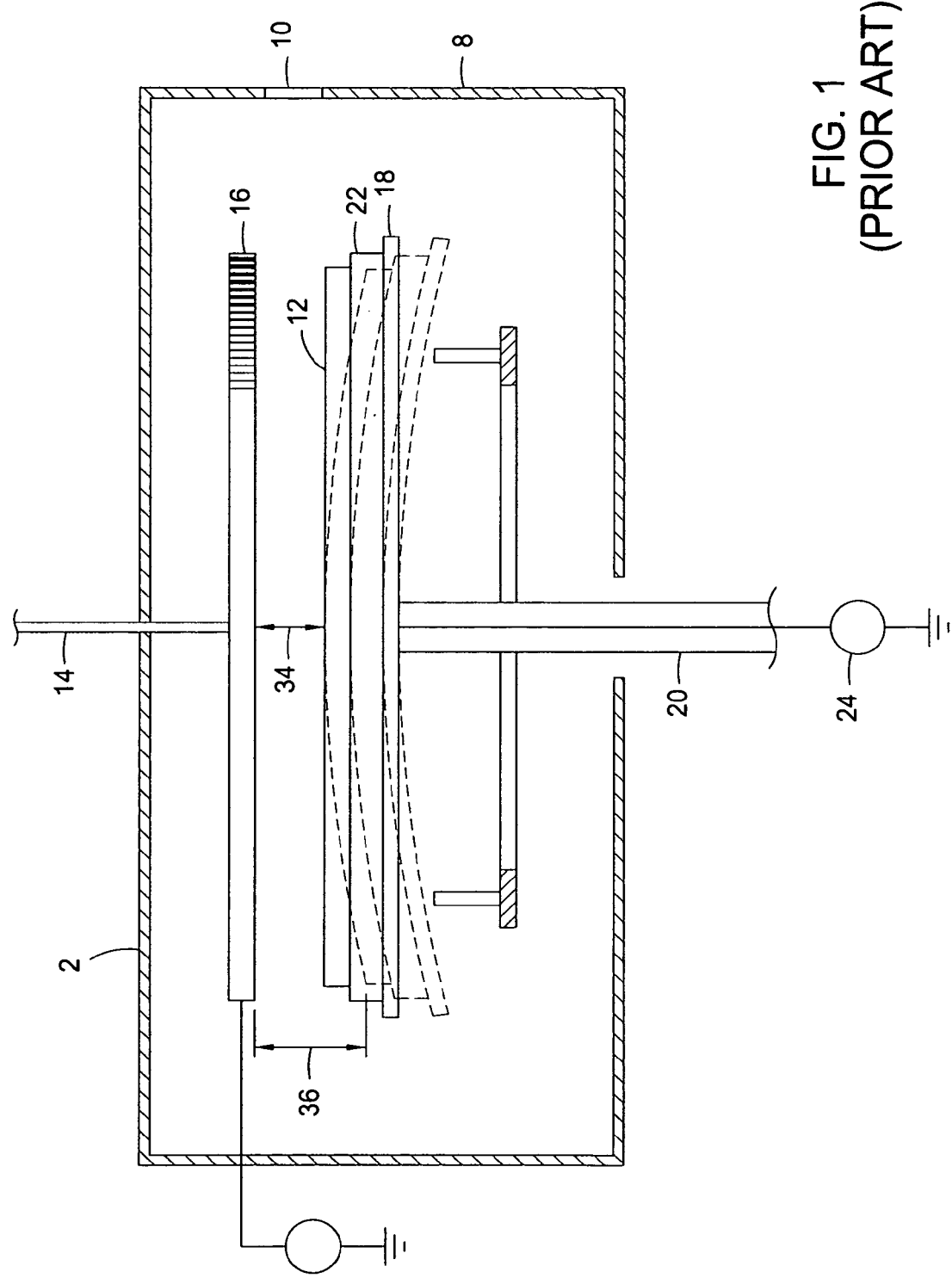
FIG. 1 depicts a schematic sectional view of a substrate support in a CVD process chamber.
Figure 2:
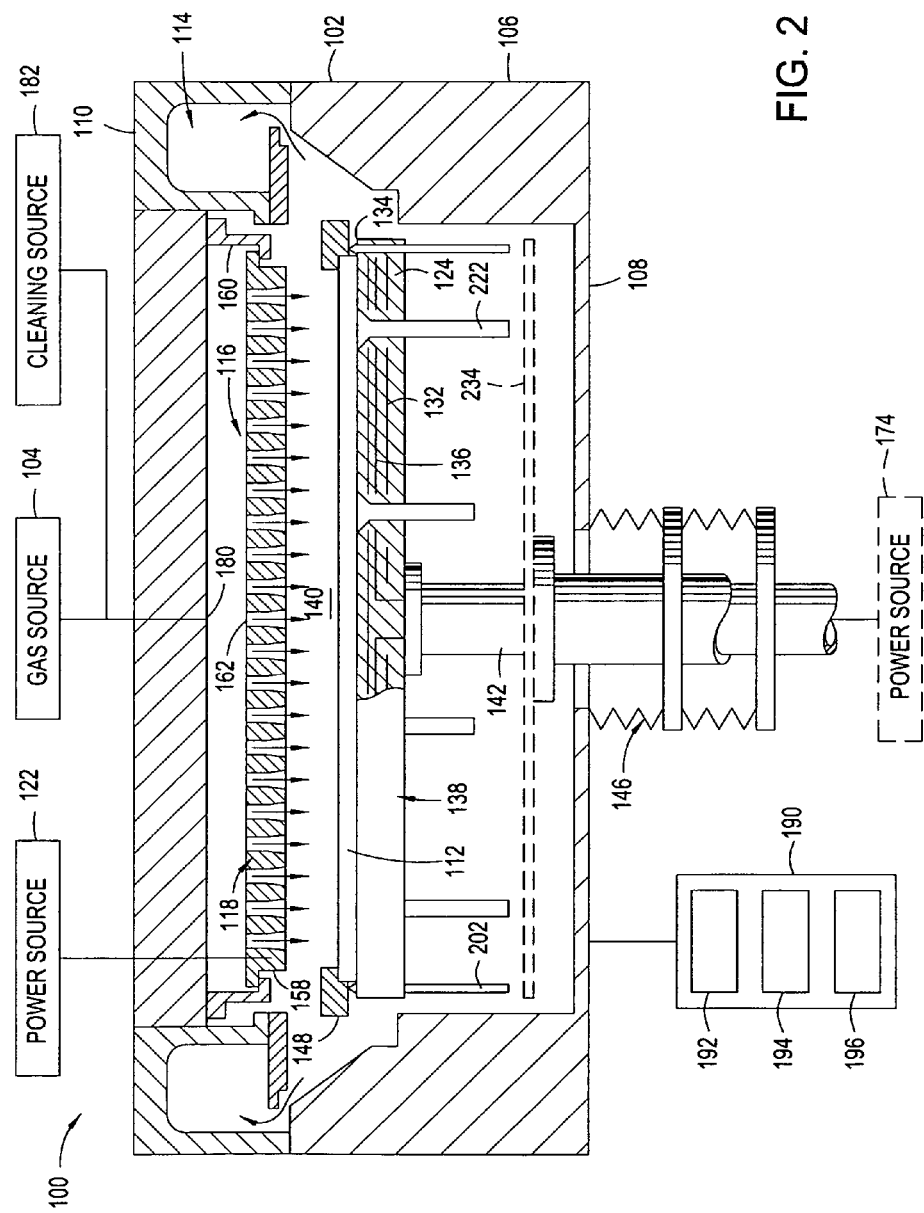
FIG. 2 depicts a schematic sectional view of one embodiment of a process chamber having a substrate support assembly of the invention.

The invention provides a substrate support assembly and method for controlling the temperature of a substrate within a process chamber on a large area substrate. FIG. 2 illustrates an exemplary process chamber 100 according to one embodiment of the invention. The invention is illustratively described below in reference to a plasma enhanced chemical vapor deposition process chamber for processing large area substrates, such as those available from AKT, a division of Applied Materials, Inc., Santa Clara, Calif. However, it should be understood that the invention has utility in other system configurations such as physical vapor deposition systems, ion implant systems, etch systems, chemical vapor deposition systems, and any other system in which controlling the temperature of a substrate on a substrate support within a process chamber is desired.

The process chamber 100 includes a chamber body 102 having walls 106 and a bottom 108 that partially define a process volume 140. The process volume 140 is typically accessed through a port and a valve (not shown) to facilitate movement of a substrate 112, such as a large area glass substrate, into and out of the process chamber 100. The walls 106 support a lid assembly 110 that contains a pumping plenum 114 that couples the process volume 140 to an exhaust port (that includes various pumping components, not shown) for exhausting any gases and process by-products out of the process chamber 100. The process chamber 100 is usually coupled to one or more supply sources 104 for delivery of one or more source compounds and/or precursors, e.g., a silicon-containing compound supply source, a oxygen-containing compound supply source, a hydrogen gas supply source, a carbon-containing compound supply source, among others, and/or combinations thereof.

A substrate support assembly 138 is generally disposed on the bottom of the chamber body 102. The support assembly 138 generally is grounded such that RF power supplied by a power source 122 to a gas distribution plate assembly 118 positioned between the lid assembly 110 and the substrate support assembly 138 (or other electrode positioned within or near the lid assembly 110 of the process chamber 100) may excite gases, source compounds, and/or precursors present in the process volume 140 between the substrate support assembly 138 and the gas distribution plate assembly 118. The RF power from the power source 122 is generally selected commensurate with the size of the substrate 112 to drive the chemical vapor deposition process. In one embodiment, a RF power of about 400 W or larger, such as between about 2,000 W to about 4,000 W or between about 10,000 W to about 20,000 W, can be applied to the power source 122 to generate an electric field in the process volume 140. For example, a power density of about 0.2 watts/cm$^2$ or larger, such as between about 0.2 watts/cm$^2$ to about 0.8 watt/cm$^2$, or about 0.45 watts/cm$^2$, can be used to be compatible with a low temperature substrate deposition method of the invention. The power source 122 and matching network (not shown) create and sustain a plasma of the process gases from the precursor gases in the process volume 140. Preferably high frequency RF power of 13.56 MHz can be used, but this is not critical and lower frequencies can also be used. Further, the walls of the chamber can be protected by covering with a ceramic material or anodized aluminum material.

Generally, the substrate support assembly 138 is coupled to a shaft 142 and connected to a lift system (not shown) for moving the substrate support assembly 138 between an elevated processing position (as shown) and a lowered substrate transfer position. The shaft 142 additionally provides a conduit for electrical and thermocouple leads between the substrate support assembly 138 and other components of the process chamber 100. A bellows 146 is coupled to the substrate support assembly 138 to provide a vacuum seal between the process volume 140 and the atmosphere outside the process chamber 100 and facilitate vertical movement of the substrate support assembly 138. The lift system of the substrate support assembly 138 is generally adjusted such that a spacing between the substrate 112 and the gas distribution plate assembly 118 is optimized, such as at about 400 mils or larger, during processing. The ability to adjust the spacing enables the process to be optimized over a wide range of deposition conditions, while maintaining the required film uniformity over the area of a large substrate.

The substrate support assembly 138 includes a conductive body 124 having a substrate support surface 134 to support the substrate 112 thereon within the process volume 140 during substrate processing. The conductive body 124 can be made of a metal or metal alloy material which provides thermal conductivity. In one embodiment, the conductive body 124 is made of an aluminum material. However, other suitable materials can also be used. The substrate support assembly 138 additionally supports a shadow frame 148 circumscribing the substrate 112 disposed on the substrate supporting surface 134 during substrate processing.

Generally, the shadow frame 148 prevents deposition at the edge of the substrate 112 and the substrate support assembly 138 so that the substrate 112 does not stick to the support assembly 138. The shadow frame 148 is generally positioned alongside inner wall of the chamber body 102 when the substrate support assembly 138 is in a lower non-processing position (not shown). The shadow frame 148 can be engaged and aligned to the conductive body 124 of the substrate support assembly 138, when the substrate support assembly 138 is in an upper processing position, as shown in FIG. 2, by matching one or more alignment grooves on the shadow frame 148 with one or more alignment pins 202. The one or more alignment pins 202 are adapted to pass through one or more alignment pin holes 204 located on and near the perimeter of the conductive body 124. The one or more alignment pins 202 may be optionally supported by a support pin plate 234 to be movable with the conductive body 124 during substrate loading and unloading.

The substrate support assembly 138 which is temperature controlled may also include one or more electrodes and/or heating elements 132 coupled to a power source 174 to controllably heat the substrate support assembly 138 and the substrate 112 positioned thereon to a predetermined temperature range, e.g., a set point temperature of about 100° C. or higher. In one embodiment, the one or more heating elements 132 are embedded within the conductive body 124.

Figure 3A:
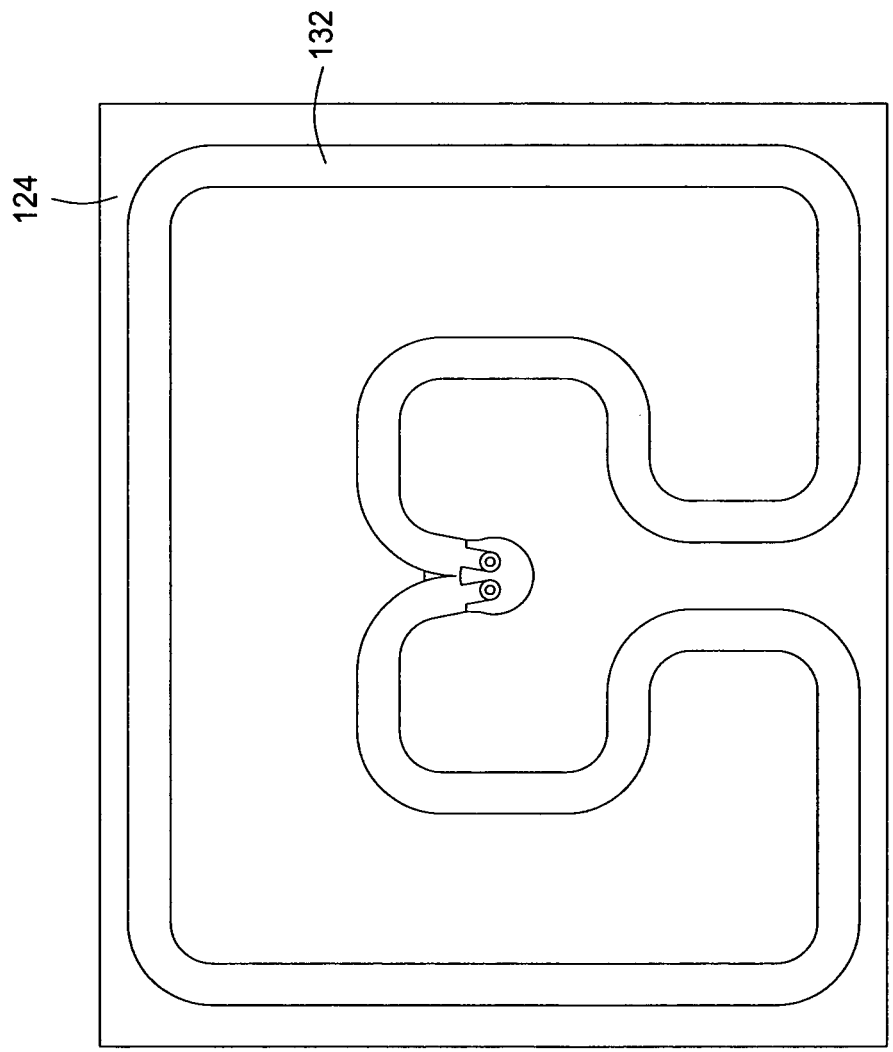
FIG. 3A is a planar-view of a substrate support body according to one embodiment of the invention.
Figure 3B:
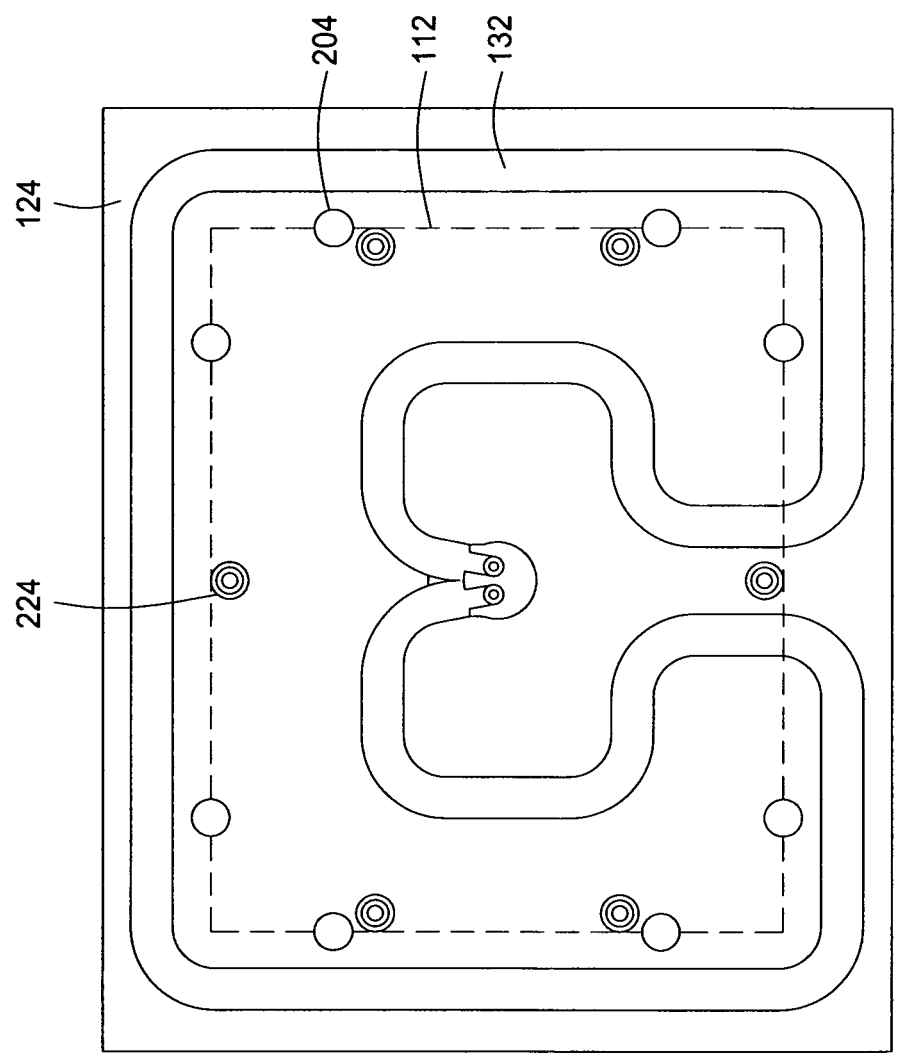
FIG. 3B is another planar view of a substrate support body according to another embodiment of the invention.

FIGS. 3A-3B illustrate planar views of the one or more heating elements 132 disposed in the conductive body 124, according to one or more aspects of the invention. For example, as shown in FIG. 3A, the heating element 132 may enter the conductive body 124 through the shaft 142, loop around a center region of the conductive body 124 in one or more inner loops and around an outer perimeter of the conductive body 124 in one or more outer loops, and exit through the shaft 142, such that the one or more heating elements 132 is embedded across the dimension of the conductive body 124.

In addition, one or more thermocouples (not shown) can be used within the substrate support assembly 138. In one embodiment, two thermocouples are used, such as one for the center region and one for the outer perimeter of the conductive body 124. However, other heater lines or channel configurations can also be used. For example, the one or more heating elements 132 can also be positioned on the back side of the conductive body 124 or clamped onto the conductive body 124 by a clamp plate. The one or more heating elements 132 may be resistively heated or by other heating means to a predetermined temperature of about 100° C. or higher.

The substrate support assembly 138 may include additional mechanisms adapted to retain and align the substrate 112. For example, the conductive body 124 may include one or more substrate support pin holes 224 for a plurality of substrate support pins 222 therethrough and adapted to support the substrate 112 a small distance above the conductive body 124. The substrate support pins 222 can be positioned near the perimeter of the substrate 112 to facilitate the placement or removal of the substrate 112 by a transfer robot or other transfer mechanism disposed exterior to the process chamber 100 without interfering with the transfer robot. In one embodiment, the substrate support pins 222 can be made of an insulating material, such as ceramic materials, anodized aluminum oxides materials, among others, to provide electrical insulation during substrate processing and still being thermally conductive. The substrate support pins 222 may be optionally supported by the support pin plate 234 such that the substrate support pins 222 are movable within the substrate support assembly 138 for lifting the substrate 112 during substrate loading and unloading. Alternatively, the substrate support pins 222 may be secured to the chamber bottom and the conductive body 124 is vertically movable for the substrate support pins 222 to pass through.

In another embodiment, at least one outer loop of the heating element 132 is configured to align to an outer perimeter of the substrate 122 when the substrate 112 is placed onto the substrate support surface 134 of the conductive body 124. For example, when the dimension of the conductive body 124 is larger than the dimension of the substrate 112, the position of the at least one outer loop of the heating element 132 may be configured to enclose the perimeter of the substrate 112 without interfering with the positions of one or more pin holes on the conductive body 124, e.g., the substrate support pin holes 224 or the alignment pin holes 204.

As shown in FIG. 3B, one embodiment of the invention provides that the at least one outer loop of the heating element 132 is positioned to surround the outer edges of the substrate 112. Preferably, the at least one outer loop of the heating element 132 is positioned around the one or more substrate support pin holes 224 and farther away from the center of the conductive body 124 without interfering with the positions of the one or more substrate support pin holes 224, thus, the positions of the substrate support pins 222 for supporting the edges of the substrate 112. Further, another embodiment of the invention provides that the at least one outer loop of the heating element 132 is positioned between the one or more substrate support pin holes 224 and the outer edges of the conductive body 124 in order to provide heating to the edges and perimeter of the substrate 112.

According to one or more aspects of the invention, the substrate support assembly 138 further includes one or more cooling channels 136 embedded within the conductive body 124. The one or more cooling channels 136 are configured to maintain temperature control and compensate temperature variation which may occur during substrate processing, such as a temperature increase or spike when a RF plasma is generated inside the process chamber 100. The diameter of the cooling channel 136 is not limited and can be any suitable diameters, such as between about 1 mm to about 15 mm, e.g., about 9 mm. In addition, the cooling channel 136 can be made of a metal or metal alloy material which provides thermal conductivity. In one embodiment, the cooling channel 136 is made of a stainless steel material. However, other suitable materials or configurations can also be used.

The cooling channels 136 are adapted to flow cooling fluids therein, such as gaseous materials, water, coolants, and other suitable cooling gases or liquid materials therein. Preferably, gaseous materials are used. Suitable gaseous materials may include clean dry air, compressed air, filtered air, nitrogen gas, hydrogen gas, inert gas (e.g., argon gas, helium gas, etc.), and other gases. Flowing a gaseous material inside the one or more cooling channels 136 is beneficial than flowing cooling water therein, even though cooling water can be used to advantage, since the gaseous material can provide cooling capability at a broader temperature range without the possibility of moisture leak to affect the quality of the deposited film on the processing substrate and chamber components. For example, the gaseous material of about 10° C. to about 25° C. can be used to flow into the one or more cooling channels 136 and provide temperature cooling control from room temperature up to a high temperature of about 200° C. or higher, whereas cooling water generally operates at between about 20° C. to about 100° C.

Further, the cooling fluids flowing inside the cooling channels 136 can be operated at a controlled flow rate to control cooling efficiency during substrate processing when the substrate 112 is heated by the heating element 132 and/or during chamber idle time. For example, for an exemplary cooling channel of about 9 mm in diameter, a pressure of about 25 psi to about 100 psi, such as about 50 psi, can be used to flow a gaseous cooling material. Thus, using the substrate support assembly 138 of the invention having the heating element 132 and the cooling channels 136, the temperature of the substrate 112 can be kept constant and a uniform temperature distribution across the whole large surface area of the substrate 112 is maintained.

Figure 4A:
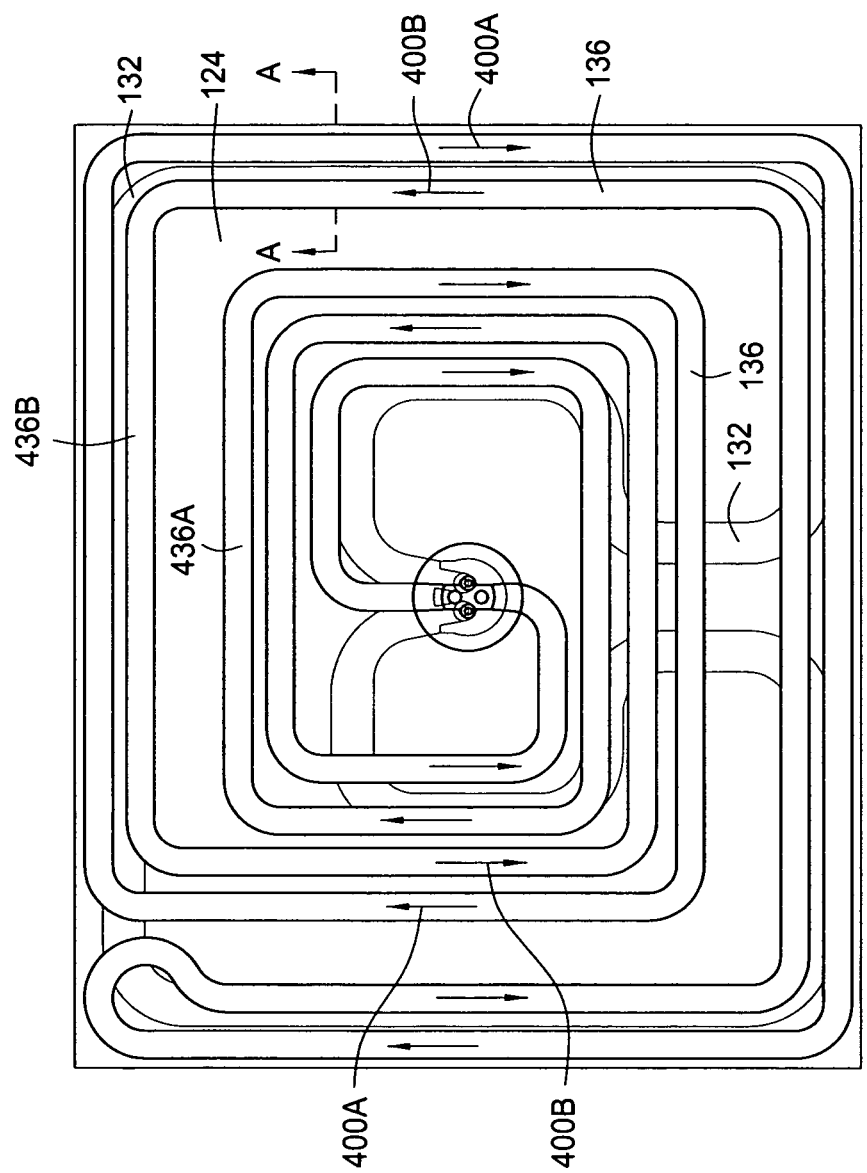
FIG. 4A is a planar view of a substrate support body according to one embodiment of the invention.
Figure 4B:
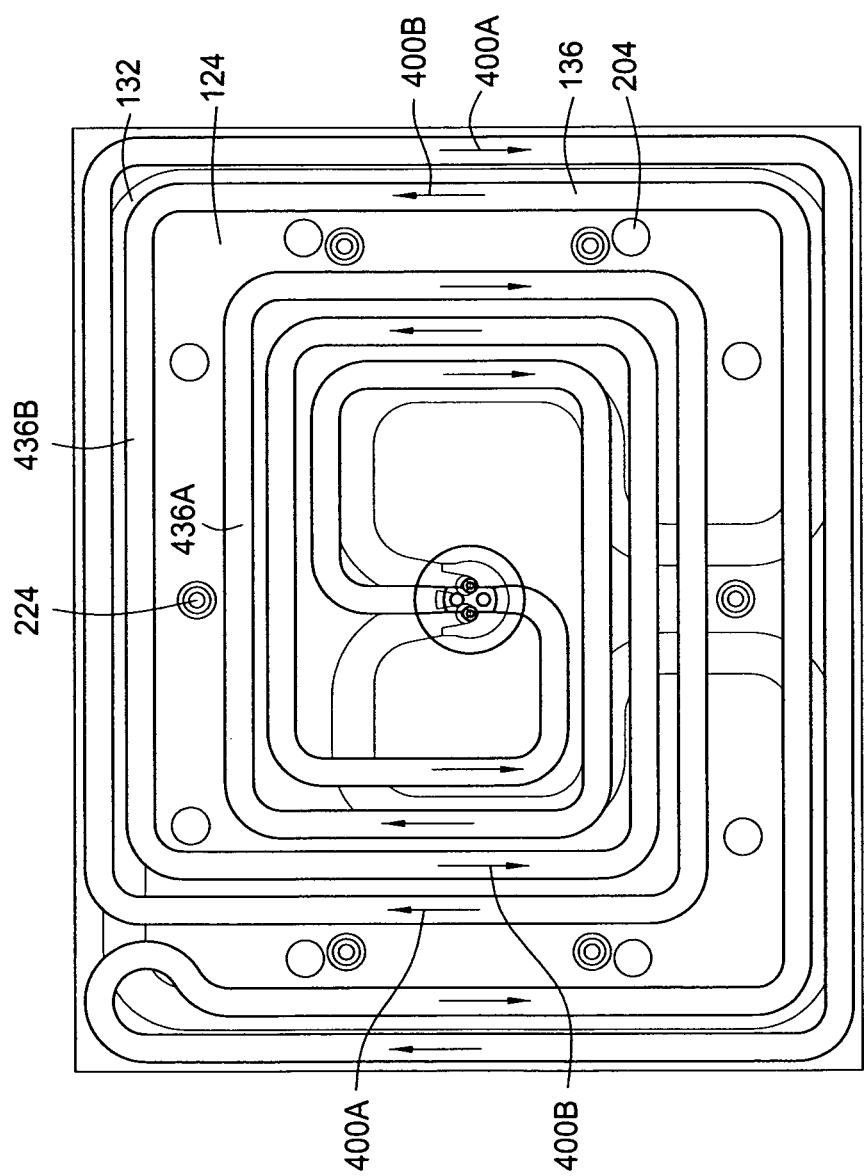
FIG. 4B is another planar view of a substrate support body according to another embodiment of the invention.
Figure 4C:
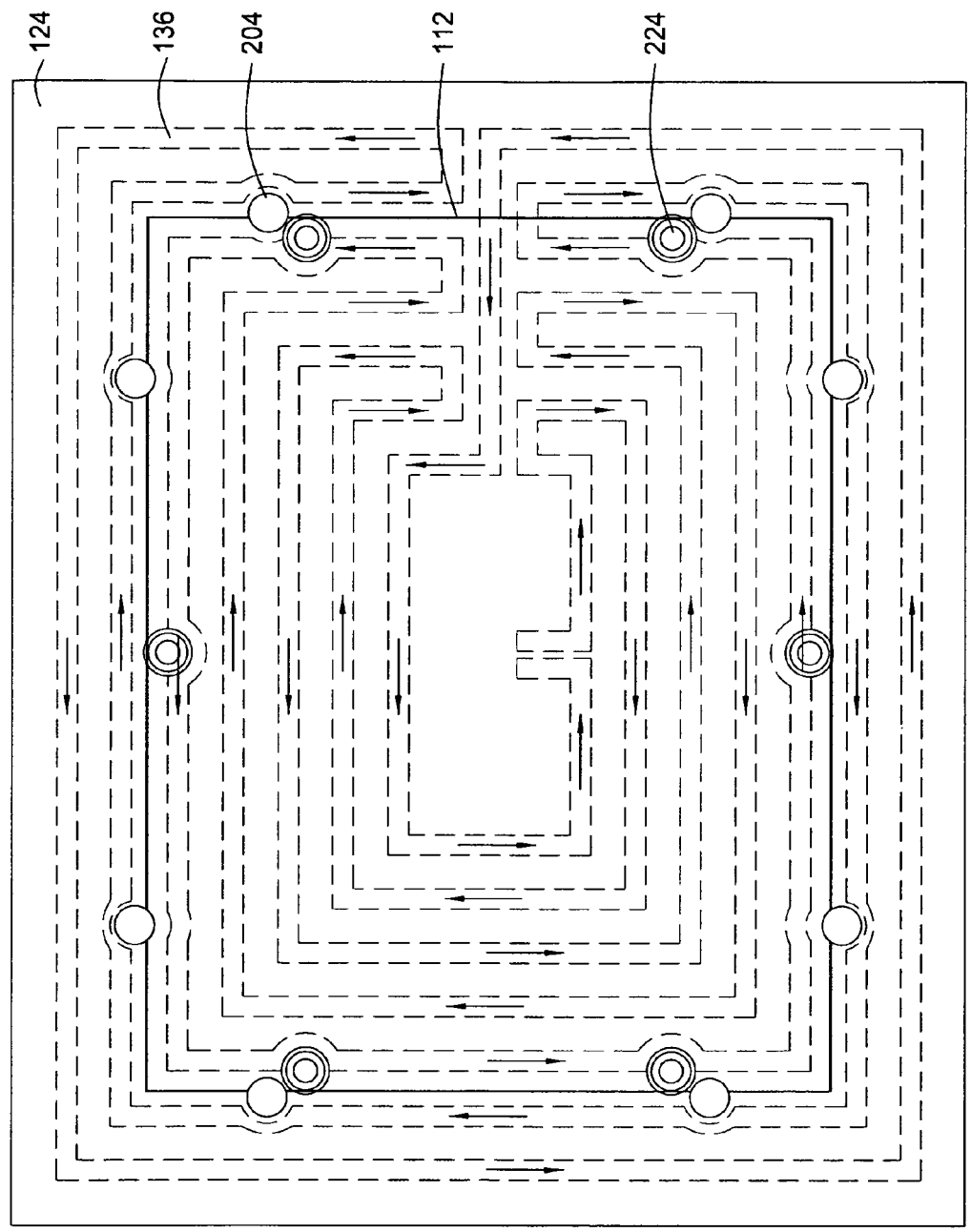
FIG. 4C is still another planar view of a substrate support body according to another embodiment of the invention.

FIGS. 4A-4C illustrate exemplary configurations of the heating element 132 and the cooling channels 136 disposed in the conductive body 124 of the substrate support assembly 138. As shown in FIG. 4A, cooling fluid may be flown into the conductive body 124 through one or more in-flow cooling channels extending from the central shaft toward the conductive body 124 in a flow direction 400A, where the one or more in-flow cooling channels extend into and out toward the perimeter of the conductive body 124 in a spiral configuration or vortex shape.

Then, as shown in FIG. 4A, the cooling fluid is flown from the in-flow cooling channels to one or more out-flow cooling channels extending toward the central shaft in a flow direction 400B, where the one or more out-flow cooling channels extend out of the conductive body 124 in a spiral configuration. Thus, overall, the cooling channels 136 may be configured, in one embodiment, in a double spiral configuration, one spiral in-flow and another spiral out-flow as indicated by the flow directions 400A and 400B. In addition, as shown in FIG. 4A, the neighboring loops or channels of the cooling channels 136 are configured for flowing the cooling fluid in opposite directions, as indicated by the flow directions 400A and 400B.

FIG. 4B demonstrates another exemplary cooling channels and heating element of the invention. The cooling channels 136 may enter the conductive body 124 through the shaft 142 and are configured to form into one or more inner cooling loops 436A to loop around the one or more inner loops of the heating element 132. The cooling channels 136 can also be configured to form into one or more outer cooling loops 436B and also loop around the one or more outer loops of the heating element 132 near the outer perimeter of the conductive body 124. Then, the cooling channel 136 can exit through the shaft 142. In one embodiment, the inner cooling loops 436A and the outer cooling loops 436B of the cooling channels 136 are configured in a spiral, vortex configuration. For example, the inner cooling loops 436A and the outer cooling loops 436B are configured to loop from the center portion of the conductive body 124, out toward the perimeter of the conductive body 124, and loop back to the center portion of the shaft 142 of the substrate support assembly 138. In another embodiment, the inner cooling loops 436A and the outer cooling loops 436B of the cooling channels 136 are adapted to be spaced apart from the one or more substrate support pin holes 224 configured for the substrate support pins 222 to passthrough without interfering with the positions of the one or more substrate support pin holes 224 on the conductive body 124.

FIG. 4C demonstrates another exemplary cooling channels configuration according to one or more aspects of the invention. The one or more cooling channels can be configured in a spiral interlooping "C" configuration, looping in a flow direction as shown by the arrows of FIG. 4C. Accordingly, the cooling channels 136 can be distributed across the dimension of the conductive body 124.

Figure 5:
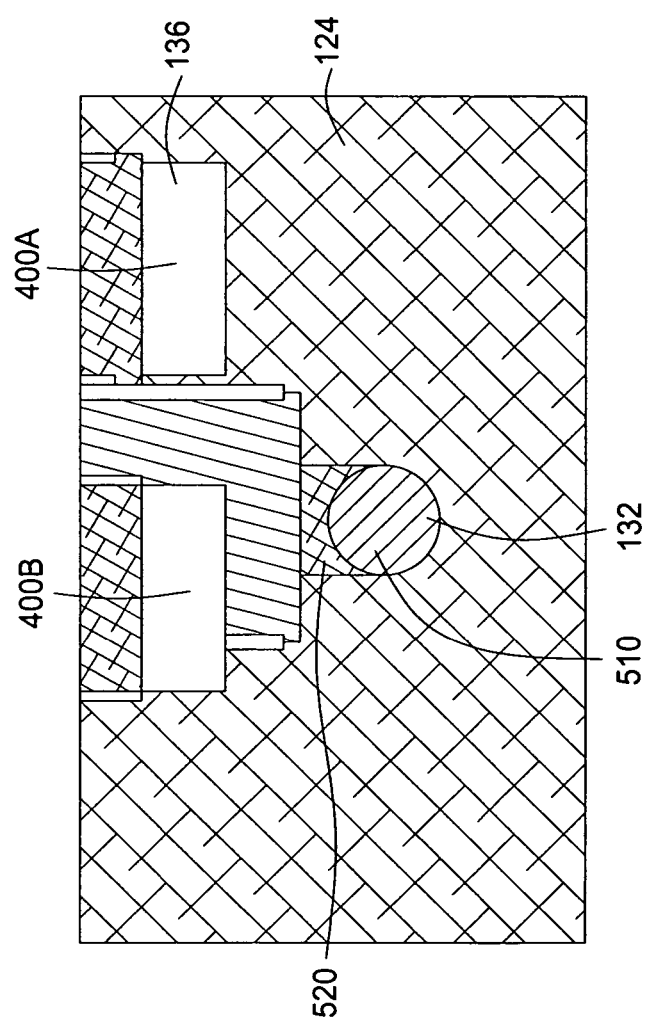
FIG. 5 is a cross-sectional view of one embodiment of a substrate support body of the invention.

FIG. 5 illustrates a cross sectional view across section A-A, according to one or more aspects of the invention. As illustrated in FIG. 5, one embodiment of the invention provides that the cooling channel 136 is configured to be positioned above the heating element 132 to provide sufficient temperature control within the conductive body 124 of the substrate support assembly 138. The heating element 132 may include a coil 510 therein and some additional insulation material 520. In addition, loops, tubings, or channels for the one or more heating elements 132 and the one or more cooling channels 136 may be fabricated and bonded into the conductive body 124 of the substrate support assembly 138 using any known bonding techniques, such as welding, sand blasting, high pressure bonding, adhesive bonding, forging, among others.

In one embodiment, the loops, tubings and/or channels of the cooling channels 136 are configured to be positioned around the channels and/or loops of the heating element 132 such that the cooling channels 136 can be distributed across the dimension of the conductive body 124. For example, as shown in FIG. 5, at least two or more loops of the cooling channels 136 are embedded above one channel of the heating element 132. Preferably, the two or more loops of the cooling channels 136 above the one channel of the heating element 132 include the gaseous material flowing therein in opposite flow directions 400A and 400B.

Accordingly, the one or more heating elements 132 and the one or more cooling channels 136 are disposed in the substrate support assembly 138 to maintain the substrate 112 at a uniform temperature of 400° C. or lower, such as between about 100° C. to about 200° C. The heating efficiency of the heating element 132 can be adjusted by the power source 174 and the cooling efficiency of the cooling channels 136 can be adjusted by the flow rate of the gaseous material flown therein, two-way heating-cooling temperature control.

As a result, the substrate support assembly 138 and the substrate 112 positioned thereon is controllably maintained at a predetermined set point temperature constantly. Using the substrate support assembly of the invention, a temperature uniformity of about +/−5° C. or less at the set point temperature can be observed for the conductive body 124 of the substrate support assembly 138. Even after multiple substrates have been processed by the process chamber, a process set point temperature repeatability of about +/−2° C. or less can be observed. In one embodiment, the temperature of the substrate 112 is kept constant, having a normalized temperature variation of about +/−10° C. temperature, such as about +/−5° C. temperature variation.

In addition, a base support plate may be positioned below the conductive body 124 to provide structural support to the substrate support assembly 138 and the substrate 112 thereon to prevent them from deflecting due to gravity and high temperature and to ensure relatively uniform and repeatable contact between the conductive body 124 and the substrate 112. Accordingly, the conductive body 124 in the substrate support assembly 138 of the invention provides a simple design with heating and cooling capability to control the temperature of the large area substrate without the use of an electrostatic chuck, since applying any pressure, gas, or fluid to the back side of the substrate to vacuum chuck a large area glass substrate may easily lead to glass breakage.

Referring back to FIG. 2, the lid assembly 110 typically includes an entry port 180 through which process gases provided by the supply source 104 are introduced into the process chamber 100. The entry port 180 is also coupled to a cleaning source 182 to provide a cleaning agent, such as disassociated fluorine, into the process chamber 100 to remove deposition by-products and films from process chamber hardware, including the gas distribution plate assembly 118.

The gas distribution plate assembly 118 is typically configured to substantially follow the profile of the substrate 112, for example, rectangular for large area substrates and circular for wafers. The gas distribution plate assembly 118 includes a perforated area 116 through which precursors and other gases, such as hydrogen gas, supplied from the supply source 104 are delivered to the process volume 140. The perforated area 116 is configured to provide uniform distribution of gases passing through the gas distribution plate assembly 118 into the process chamber 100. The gas distribution plate assembly 118 typically includes a diffuser plate 158 suspended from a hanger plate 160. A plurality of gas passages 162 are formed through the diffuser plate 158 to allow a predetermined distribution of gas passing through the gas distribution plate assembly 118 and into the process volume 140.

A controller 190 is included to interface with and control various components of the process chamber 100. The controller 190 typically includes a central processing unit (CPU) 194, support circuits 196 and a memory 192. The CPU 194 may be one of any forms of computer processors that can be used in an industrial setting for controlling various chambers, apparatuses, and chamber peripherals. The memory 192, any software, or any computer-readable medium coupled to the CPU 194 may be one or more readily available memory devices, such as random access memory (RAM), read only memory (ROM), hard disk, CD, floppy disk, or any other form of digital storage, for local or remote for memory storage. The support circuits 196 are coupled to the CPU 194 for supporting the CPU 194 in a conventional manner. These circuits include cache, power supplies, clock circuits, input/output circuitry, subsystems, and the like.

In one embodiment, the substrate support assembly 138 of the process chamber 100 of the invention is adapted to process a rectangular substrate. The surface area of a rectangular substrate for flat panel display is typically large, for example, a rectangle of about 300 mm by about 400 mm or larger, e.g., about 370 mm×about 470 mm or larger. The dimensions of the chamber body 102, the conductive body 124, and related components of the process chamber 100 are not limited and generally are proportionally larger than the size and dimension of the substrate 112 to be processed in the process chamber 100. For example, when processing a large area square substrate having a width of about 370 to about 2160 mm and a length of about 470 mm to about 2460 mm, the conductive body may include a width of about 430 mm to about 2300 mm and a length of about 520 mm to about 2600 mm, whereas the chamber body 102 may include a width of about 570 mm to about 2360 mm and a length of about 570 mm to about 2660 mm.

For flat panel display application, the substrate 112 may comprise a material that is essentially optically transparent in the visible spectrum, for example glass or clear plastic. For example, for thin film transistor applications, the substrate 112 may be a large area glass substrate having a high degree of optical transparency. However, the invention is equally applicable to substrate processing of any types and sizes. Substrates of the invention can be circular, square, rectangular, or polygonal for flat panel display manufacturing. In addition, the invention applies to substrates for fabricating any devices, such as flat panel display (FPD), flexible display, organic light emitting diode (OLED) displays, flexible organic light emitting diode (FOLED) display, polymer light emitting diode (PLED) display, liquid crystal displays (LCD), organic thin film transistor, active matrix, passive matrix, top emission device, bottom emission device, solar cell, solar panel, etc., and can be on any of the silicon wafers, glass substrates, metal substrates, plastic films (e.g., polyethylene terephthalate (PET), polyethylene naphthalate (PEN), etc.), plastic epoxy films, among others. The invention is especially suitable for a low temperature PECVD process, such as those techniques used for fabricating a flexible display device, where temperature cooling control during substrate processing is desired.

Figure 6:
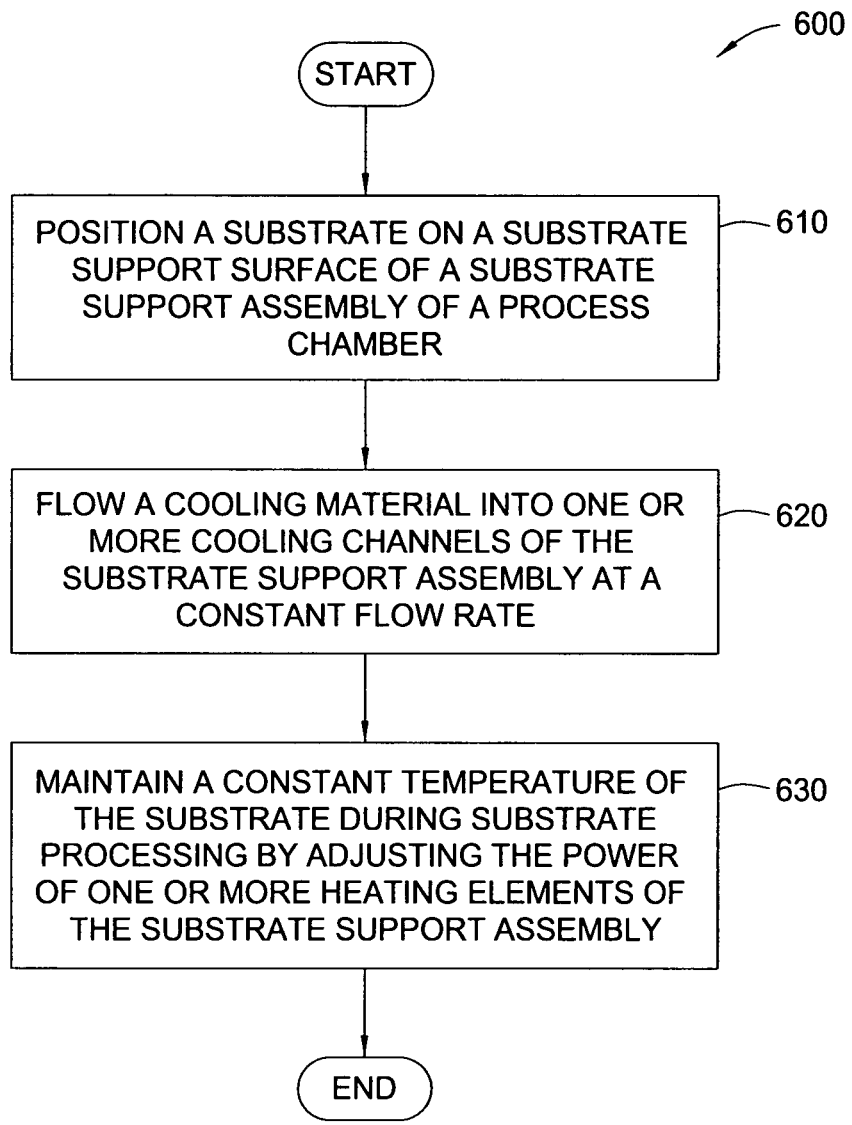
FIG. 6 is a flow diagram of one embodiment of a method for controlling the temperature of a substrate within a process chamber.

FIG. 6 is a flow diagram of one exemplary method 600 for controlling the temperature of a substrate within a process chamber. In operation, the substrate is positioned on a substrate support surface of a substrate support assembly inside the process chamber at step 610. Before and/or during substrate processing, the temperature of the substrate support surface on top of a conductive body of the substrate support assembly is kept at a set point temperature, such as between about 100° C. to about 200° C. At step 620, a cooling gas or air is flown at a constant flow rate into one or more cooling channels embedded in the conductive body of the substrate support assembly.

In one embodiment, the cooling gas can be flown into the cooling channel even at chamber idle time, non-processing time, or chamber cleaning/maintenance time. As a result, the one or more cooling channels of the invention are active all the time. In another embodiment, the set point temperature used for chamber idle time is the same temperature as a process temperature that will be set during substrate processing.

At step 630, the temperature of the substrate is maintained constantly during substrate processing by adjusting the heating efficiency of one or more heating elements embedded in the conductive body of the substrate support assembly. For example, the heating efficiency of the heating elements can be adjusted by adjusting the power of a power source connected to the heating elements. In one embodiment, the temperature of the substrate can be maintained to a constant process temperature of about 100° C. to about 200° C. across the entire surface of the substrate by fine-tuning the power of the power source for the heating elements regardless of whether a plasma is induced or any additional heat generated from the energy of the plasma is directed onto the substrate in order to prevent any temperature spike or variation on the surface of the substrate. As a result, one control loop may be need for software designs within the controller 190 for adjusting the heating efficiency, as compared to a more complicated two or more control loops for adjusting both heating and cooling efficiencies. Accordingly, the method 600 of the invention provides a simple and reliable temperature control mechanism by controlling the heating efficiency for the substrate support assembly. However, the heating and/or cooling efficiencies of the substrate support assembly 138 of the invention can be adjusted.

In operation, one or more heating elements of the substrate support assembly can be set at a set point temperature of about 150° C. and a gaseous cooling material of clean dry air or compressed air having a temperature of about 16° C. can be flown into the cooling channels at a constant flow rate to maintain the temperature of a substrate support surface of a substrate support assembly. When a plasma or an additional heat source is present inside the process chamber near the top of the substrate support surface, a constant flow of the cooling material using a pressure of about 50 psi is tested to maintained the temperature of the substrate support surface constantly at about 150° C. with a surface temperature uniformity of about +/−2° C. It is tested that the presence of an additional heat source even at about 300° C., will not affect the temperature of the substrate support surface such that the substrate support surface was tested to be kept constantly at about 150° C. by flowing the cooling fluid having an input temperature of about 16° C. inside the cooling channels of the invention. The cooling gas after cooling and after being flown out of the substrate support assembly is tested to be at an output temperature of about 120° C. Therefore, the cooling gas flowing inside the cooling channels of the invention exhibits a very efficient cooling effect, which is reflected by the difference of more than 100° C. between the output temperature and the input temperature of the cooling gas.

Although several preferred embodiments which incorporate the teachings of the present invention have been shown and described in detail, those skilled in the art can readily devise many other varied embodiments that still incorporate these teachings. While the foregoing is directed to embodiments of the present invention, other and further embodiments of the invention may be devised without departing from the basic scope thereof, and the scope thereof is determined by the claims that follow.

We claim:

1. A substrate support assembly adapted to support a large area substrate inside a process chamber, comprising:
    a unitary, thermally conductive body comprising a metal or metal alloy, the thermally conductive body having one or more substrate support pin holes and one or more cooling channels within the thermally conductive body, wherein the one or more cooling channels are configured to form one or more inner cooling loops and one or more outer cooling loops, the inner and outer cooling loops being configured to flow cooling fluid in opposite flow directions, and wherein the inner cooling loops and the outer cooling loops are spaced apart from the one or more substrate support pin holes;
    a substrate support surface on the surface of the thermally conductive body and adapted to support the large area substrate thereon; and
    one or more heating elements embedded within the thermally conductive body, wherein one of the one or more inner cooling loops and one of the one or more outer cooling loops are disposed parallel to each other and parallel to one of the one or more heating elements.

2. The substrate support assembly of claim 1, wherein the one or more cooling channels comprises a double spiral configuration, wherein one spiral includes one or more in-flow loops and the other spiral includes one or more out-flow loops, and wherein the in-flow loops enter through a center portion of the thermally conductive body and the out-flow loops exit through a center portion of the thermally conductive body.

3. The substrate support assembly of claim 1, wherein the one or more cooling channels loop around the positions of the one or more heating elements.

4. The substrate support assembly of claim 1, wherein the one or more cooling channels are configured to form inner cooling loops and outer cooling loops as shown in FIG. 4B.

5. The substrate support assembly of claim 1, wherein the one or more cooling channels are configured in a spiral interlooping "C" configuration as shown in FIG. 4C.

6. The substrate support assembly of claim 1, wherein the one or more cooling channels are embedded within the thermally conductive body and comprise tubing made from a stainless steel material.

7. The substrate support assembly of claim 1, wherein the one or more cooling channels are above the one or more heating elements.

8. The substrate support assembly of claim 1, wherein the dimension of the substrate support surface is larger than the dimension of the large area substrate.

9. The substrate support assembly of claim 1, wherein the thermally conductive body comprises an aluminum material.

10. The substrate support assembly of claim 1, wherein the substrate support surface is adapted to be rectangular in shape and to support a large area substrate having a dimension of about 370 mm×about 470 mm or larger.

11. A substrate support assembly adapted to support a large area glass substrate inside a process chamber, comprising:
    a unitary, thermally conductive body comprising a metal or metal alloy, the thermally conductive body having one or more substrate support pin holes and one or more cooling channels within the thermally conductive body, wherein the one or more cooling channels are configured to form one or more inner cooling loops and one or more outer cooling loops, wherein the inner cooling loops and the outer cooling loops are configured to loop from a center portion of the conductive body out toward the perimeter of the conductive body and loop back to the center portion of the conductive body, the inner and outer cooling loops being configured to flow cooling fluid in opposite flow directions, and wherein the inner cooling loops and the outer cooling loops are spaced apart from the one or more substrate support pin holes;
    a substrate support surface on the surface of the thermally conductive body and adapted to support the large area glass substrate thereon; and
    one or more heating elements embedded within the thermally conductive body, wherein one of the one or more inner cooling loops and one of the one or more outer cooling loops are disposed parallel to each other and parallel to one of the one or more heating elements.

12. The substrate support assembly of claim 11, wherein the one or more cooling channels are configured to form inner cooling loops and outer cooling loops as shown in FIG. 4B.

13. The substrate support assembly of claim 11, wherein the substrate support assembly is configured to support one or more large area rectangular substrates for fabricating devices selected from the group consisting of flat panel display (FPD), flexible display, organic light emitting diode (OLED) displays, flexible organic light emitting diode (FOLED) display, polymer light emitting diode (PLED) display, liquid crystal displays (LCD), organic thin film transistor, active matrix, passive matrix, top emission device, bottom emission device, solar cell, solar panel, and combinations thereof.

14. The substrate support assembly of claim 11, wherein the one or more cooling channels are not coplanar with the one or more heating elements.

15. The substrate support assembly of claim 14, wherein the one or more cooling channels are embedded within the thermally conductive body above the one or more heating elements and comprise tubing made from a stainless steel material.

16. The substrate support assembly of claim 11, wherein the one or more cooling channels are configured in a spiral interlooping "C" configuration as shown in FIG. 4C.

17. The substrate support assembly of claim 11, wherein the inner cooling loops enter through a center portion of the thermally conductive body and the outer cooling loops exit through a center portion of the thermally conductive body.

* * * * *